US009054652B2

(12) United States Patent
Kularatna et al.

(10) Patent No.: US 9,054,652 B2
(45) Date of Patent: Jun. 9, 2015

(54) USING FRACTIONAL DELAY COMPUTATIONS TO IMPROVE INTERMODULATION PERFORMANCE

(71) Applicant: Nokia Solutions and Networks Oy, Espoo (FI)

(72) Inventors: Shavantha Kularatna, Flower Mound, TX (US); Christian Reichl, Hirschau (DE); Bjoern Jelonnek, Ulm (DE); Glenn Schedeen, Corinth, TX (US); Sandeep Mehta, Irving, TX (US)

(73) Assignee: Nokia Solutions and Networks Oy, Espoo (FI)

( * ) Notice: Subject to any disclaimer, the term of this patent is extended or adjusted under 35 U.S.C. 154(b) by 92 days.

(21) Appl. No.: 14/044,385

(22) Filed: Oct. 2, 2013

(65) Prior Publication Data
US 2015/0091643 A1    Apr. 2, 2015

(51) Int. Cl.
*H04B 1/04*       (2006.01)
*H03F 1/32*       (2006.01)
*H03F 3/21*       (2006.01)
*H03F 3/19*       (2006.01)

(52) U.S. Cl.
CPC .............. *H03F 1/3247* (2013.01); *H03F 3/21* (2013.01); *H03F 3/19* (2013.01); *H03F 2200/451* (2013.01); *H03F 2201/3227* (2013.01)

(58) Field of Classification Search
CPC . H03F 1/3247; H03F 3/24; H03F 2201/3233; H03F 1/3241; H04B 1/4075; H04B 2001/0425

USPC .......... 455/11.2, 114.3, 115.1, 118, 119, 126, 455/127, 550.1, 552.1, 553.1; 375/297, 375/300, 302
See application file for complete search history.

(56) References Cited

U.S. PATENT DOCUMENTS

| | | | |
|---|---|---|---|
| 6,473,449 B1 * | 10/2002 | Cafarella et al. | 375/141 |
| 7,027,493 B2 * | 4/2006 | Richards | 375/150 |
| 7,394,849 B2 * | 7/2008 | Ibragimov et al. | 375/233 |
| 8,548,405 B2 * | 10/2013 | Vogas | 455/115.1 |
| 8,908,797 B2 * | 12/2014 | Jeckeln | 375/297 |

* cited by examiner

*Primary Examiner* — Nhan Lee
(74) *Attorney, Agent, or Firm* — Harrington & Smith

(57) ABSTRACT

Enhancing the intermodulation performance of an RF power amplifier by determining a coarse time delay represented by an integer T1; determining a reference point for a transmitted signal waveform of the RF power amplifier; shifting the waveform by a set of offsets comprising a plurality of non-integer fractional steps from (T1−Xd) to (T1+Xd) where T1 is the integer and Xd is a non-integer fractional step size value for defining fractional steps about the integer T1 such that the non-integer fractional steps progress in a positive direction as well as a negative direction; correlating the transmitted signal waveform with a feedback signal waveform to obtain a respective correlation value for each of corresponding fractional steps; obtaining an accurate fractional delay value by selecting a fractional step having a highest respective correlation value; applying the obtained correct fractional delay value to the transmitted signal waveform to provide a compensated transmitted signal waveform, and combining the compensated transmitted signal waveform with the feedback signal waveform to reduce at least one intermodulation product of the RF power amplifier.

21 Claims, 4 Drawing Sheets

USING FRACTIONAL DELAY COMPUTATIONS TO IMPROVE INTERMODULATION PERFORMANCE

TECHNICAL FIELD

The exemplary and non-limiting embodiments relate generally to wireless communication systems, methods, devices and computer programs and, more specifically, to using fractional delay computations to improve intermodulation performance.

BACKGROUND

This section is intended to provide a background or context. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Many telecommunications systems require linear radio frequency (RE) power amplifiers. A linear amplifier produces an output signal that is linearly related to the signal applied to the input. An amplifier that compresses its input or has a non-linear input/output relationship may provide degraded intermodulation performance, potentially resulting in interference to other radio channels.

Predistortion is a technique that has been used to improve the linearity of RF power amplifiers. A predistortion circuit inversely models the gain and phase characteristics of the RF power amplifier. When the predistortion circuit is combined with the RF power amplifier, the result is an overall system having enhanced linearity and reduced distortion. In essence, "inverse distortion" is introduced into the input of the RF power amplifier, thereby cancelling any non-linearity the RF power amplifier might otherwise exhibit. Predistortion is a cost-saving technique that enhances power efficiency. RF power amplifiers tend to become more non-linear as their output power increases towards their maximum rated output. Predistortion may be employed to obtain more usable power from the amplifier without having to build a larger, less efficient and more expensive amplifier.

Predistortion may be implemented in the analogue domain as well as the digital domain. For example, some present-day radio transmitters support Digital Pre-Distortion (DPD) for improving intermodulation performance. DPD techniques bring increased power efficiencies to the transmitter, resulting in considerable power savings for users. While it is possible to implement efficiency enhancement techniques within the context of analog devices, DPD algorithms provide additional efficiencies that could not have been achieved solely within analog domain.

DPD is effective at improving intermodulation performance when all inputs to the DPD process are accurate. Some of the key inputs to the Digital Pre-Distortion algorithm are: a) an undistorted transmitted signal; b) a feedback signal; and c) a suitable mathematical model for the radio frequency (RF) power amplifier used by the transmitter. As part of the DPD approach, the undistorted transmitted signal has to be synchronized with the feedback signal. Correct synchronization will match a sample of the transmitted signal to a correct feedback sample. Usually a timing offset has to be computed to define the match from the transmitted signal to the feedback signal. This offset is commonly known as either the timing offset or simply the delay. Throughout this specification, the word "delay" is used to refer to the timing offset between the transmitter and the feedback signal.

In order to achieve enhanced DPD performance, it is important to determine an accurate delay. For most waveforms, this delay has been defined in terms of integer samples of the DPD rate. One example of an integer sample is 1/(307.2 MHz), or 3.25 nanoseconds, where 307.2 Mega-Samples Per Second (MSPS) is the sampling rate or the processing rate. For some waveforms and their occupied bandwidths, determining an integer delay is not adequate.

SUMMARY

This summary section is intended to be merely exemplary and non-limiting.

The foregoing and other problems are overcome, and other advantages are realized, by the use of the exemplary embodiments.

In a first aspect thereof, a set of exemplary embodiments provides methods for enhancing the intermodulation performance of an RF power amplifier by determining, estimating, or computing a coarse time delay represented by an integer T1; determining or selecting a current reference point for a transmitted signal waveform of an RF power amplifier; shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1; at each of the plurality of non-integer fractional steps, correlating the transmitted signal waveform with a feedback signal waveform to obtain a respective correlation value for each of corresponding fractional steps of the plurality of non-integer fractional steps; obtaining a correct fractional delay value by selecting a fractional step of the plurality of non-integer fractional steps having a highest respective correlation value; applying the obtained correct fractional delay value to the transmitted signal waveform to provide a compensated transmitted signal waveform, and combining the compensated transmitted signal waveform with the feedback signal waveform to reduce or eliminate at least one intermodulation product of the RF power amplifier.

In a second aspect thereof, a set of exemplary embodiments provides an apparatus for enhancing the intermodulation performance of an RF power amplifier. The apparatus includes at least one processor and at least one memory storing computer program code. The at least one memory and the computer program code are configured, with the at least one processor, to cause the apparatus to perform actions. These actions include determining, estimating, or computing a coarse time delay represented by an integer T1; determining or selecting a current reference point for a transmitted signal waveform of an RF power amplifier; shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1; at each of the plurality of non-integer fractional steps, correlating the transmitted signal waveform with a feedback signal waveform to obtain a respective correlation value for each of corresponding fractional steps of the plurality of non-integer fractional steps; obtaining a correct fractional delay value by selecting a fractional step of the plurality of non-integer fractional steps having a highest respective correlation value; applying the obtained correct fractional delay value to the transmitted signal waveform to provide a compensated transmitted signal waveform, and combining the compensated transmitted signal waveform with the feedback signal waveform to reduce or eliminate at least one intermodulation product of the RF power amplifier.

In another aspect thereof an exemplary embodiment provides a computer readable medium for enhancing the intermodulation performance of an RF power amplifier. The computer readable medium is tangibly encoded with a computer program executable by a processor to perform actions. The actions include determining, estimating, or computing a coarse time delay represented by an integer T1; determining or selecting a current reference point for a transmitted signal waveform of an RF power amplifier; shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1; at each of the plurality of non-integer fractional steps, correlating the transmitted signal waveform with a feedback signal waveform to obtain a respective correlation value for each of corresponding fractional steps of the plurality of non-integer fractional steps; obtaining a correct fractional delay value by selecting a fractional step of the plurality of non-integer fractional steps having a highest respective correlation value; applying the obtained correct fractional delay value to the transmitted signal waveform to provide a compensated transmitted signal waveform, and combining the compensated transmitted signal waveform with the feedback signal waveform to reduce or eliminate at least one intermodulation product of the RF power amplifier.

BRIEF DESCRIPTION OF THE DRAWINGS

The foregoing and other aspects of exemplary embodiments are made more evident in the following Detailed Description, when read in conjunction with the attached Drawing Figures, wherein.

DETAILED DESCRIPTION

Various exemplary embodiments provide a method, apparatus and computer program(s) for determining a fractional delay and applying the fractional delay to a digital pre-distortion (DPD) correction procedure to achieve improved intermodulation performance.

Determining, calculating, or estimating an appropriate value of delay is an integral part of the DPD correction procedure. However, certain waveforms such as 2-Carrier GSM or 2-Carrier 8-PSK, as well as certain combinations of 4 Carrier GSM, 4 Carrier 8-PSK (non-contiguous), 6-C GMSK (standard cases plus non-contiguous), and 8-PSK have provided degraded intermodulation performance even when the correct delay (timing offset) is determined to the nearest integer. This degraded performance is an issue when a combination of carriers occupies a wide bandwidth in excess of approximately 15 MHz.

Consider an illustrative example wherein a 2-carrier combination occupies a bandwidth of 20 MHz. In this case, the third-order intermodulation (IM3) products are located at a distance of 30 MHz from the center of the composite waveform in the frequency domain. The fifth-order intermodulation (IM5) products are located at a distance of 50 MHz from the center of the composite waveform in the frequency domain. Similarly, the seventh-order intermodulation (IM7) products are located at a distance of 70 MHz from the composite waveform in the frequency domain. The greater the frequency separation between the intermodulation products and the center of the composite waveform, the more accurate the determined delay needs to be in order for DPD-based intermodulation cancellation techniques to be effective. For example, an ideal DPD procedure would generate an equal-magnitude IM7 product that is 180 degrees out of phase with respect to the RF power amplifier-generated IM7 product. Vectors that are equal in magnitude but opposite in phase will cancel each other out.

If the calculated, estimated, or determined delay is not sufficiently accurate, then a phase shift as computed by the DPD procedure will not be sufficient to cancel out the intermodulation products. This problem is apparent in the 1800-MHz band where the band occupies a bandwidth of 75 MHz. Hence, placement of 2 Carriers may yield IM3, IM5 and IM7 products within this 75-MHz bandwidth, requiring a fairly effective intermodulation correction scheme to meet the Third Generation Partnership Project (3GPP) specification. Basically, 3GPP requires at least 60 dBc of suppression below the carrier for all IM3 products. The higher-order IM products are required to be suppressed by at least 70 dBc correction.

Figure 1:
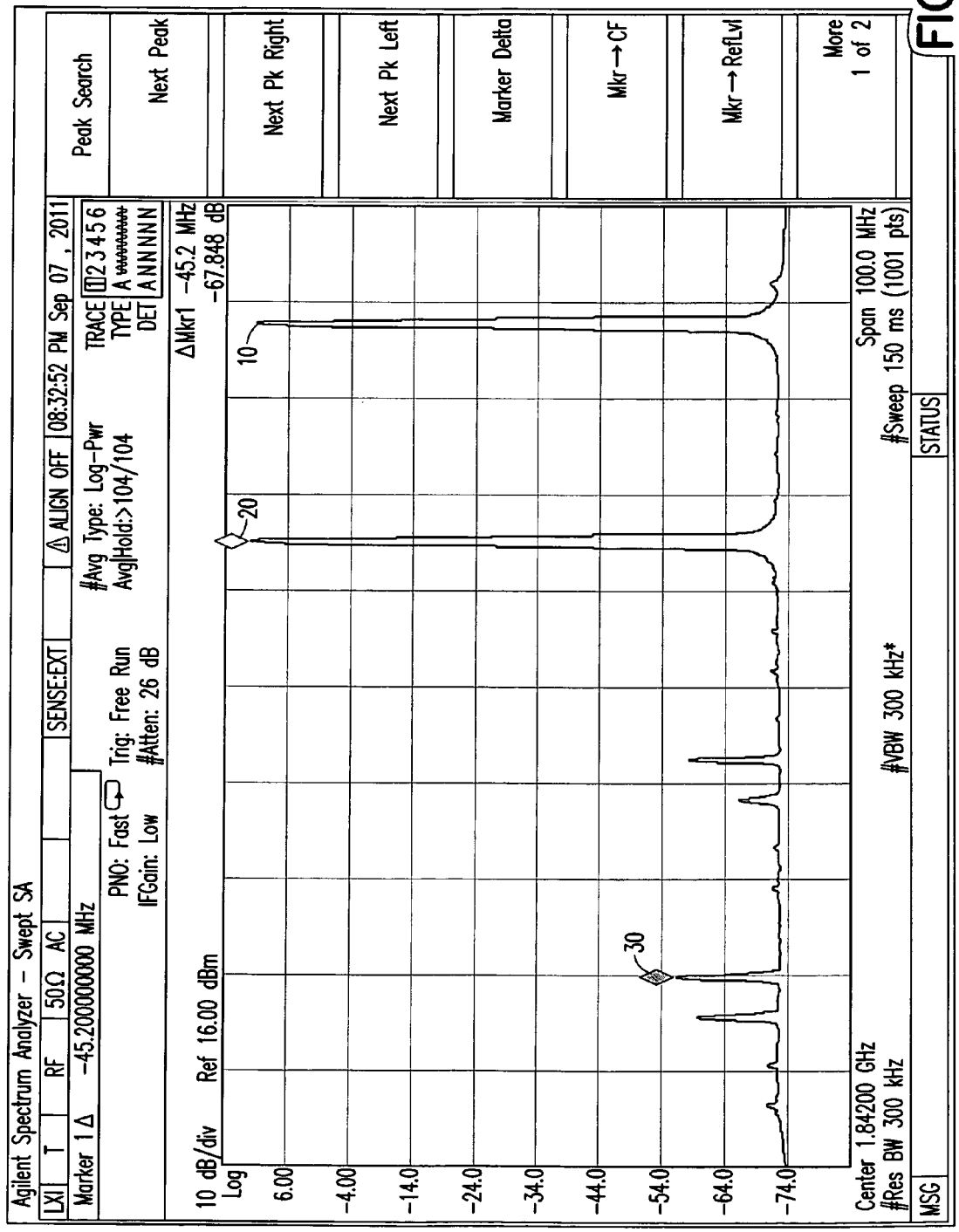
FIG. 1 is a spectral plot of amplitude as a function of frequency using conventional intermodulation correction techniques.

FIG. 1 is a spectral plot of amplitude as a function of frequency using conventional intermodulation correction techniques. A first carrier 10 is present at a first frequency and has an amplitude of approximately 16 dBm. A second carrier 20 is present at a second frequency and also has an amplitude of approximately 16 dBm. A fifth-order intermodulation component 30 that is 45.2 MHz below the second carrier 20 has an amplitude that is only 67.848 dB below the amplitudes of the first and second carriers 10, 20. Accordingly, the spectral plot of FIG. 1 clearly indicates that at least one intermodulation product (i.e., intermodulation component 30) is not within the allowable limits set forth in the 3GPP specification.

The plot of FIG. 1 was prepared using the conventional approach of determining an integer delay for DPD. However, this plot reveals that determining an integer delay for DPD is not accurate enough to achieve correction of intermodulation products in the 1800-MHz band. Although this example is specific to the 1800 MHz band, similar considerations apply to other bands which have a relatively wide bandwidth occupancy. Although FIG. 1 demonstrates failure of the fifth intermodulation product (IM5), it may be noted that third intermodulation product (IM3) failures were observed in the context of somewhat larger signal separations as well as somewhat smaller signal separations, such as 25 MHz, for example. As described in greater detail hereinafter, the failure of these intermodulation products is a direct result of not incorporating a fractional delay into an intermodulation compensation scheme.

One possible solution for ensuring that intermodulation products do not exceed the standards set forth in the 3GPP specification is to mask the problem. For example, one could conceive a solution by splitting the 1800-MHz band into two or three overlapping bands. Such an approach would help attenuate the distant IM5 and IM7 products as they will be out of band at the front end duplex filter. However, this means providing either two or three different product variants, or including two different transmit filters in a single product. A better solution is needed.

Pursuant to a set of preferred embodiments of the invention described herein, a fractional delay is determined, estimated, or computed. The fractional delay is used computation as part of the delay computation, thus avoiding rounding to the nearest integer. For example, computing the correct delay of 154.7 is better for distant intermodulation products than rounding the delay off to 155.

Figure 2:
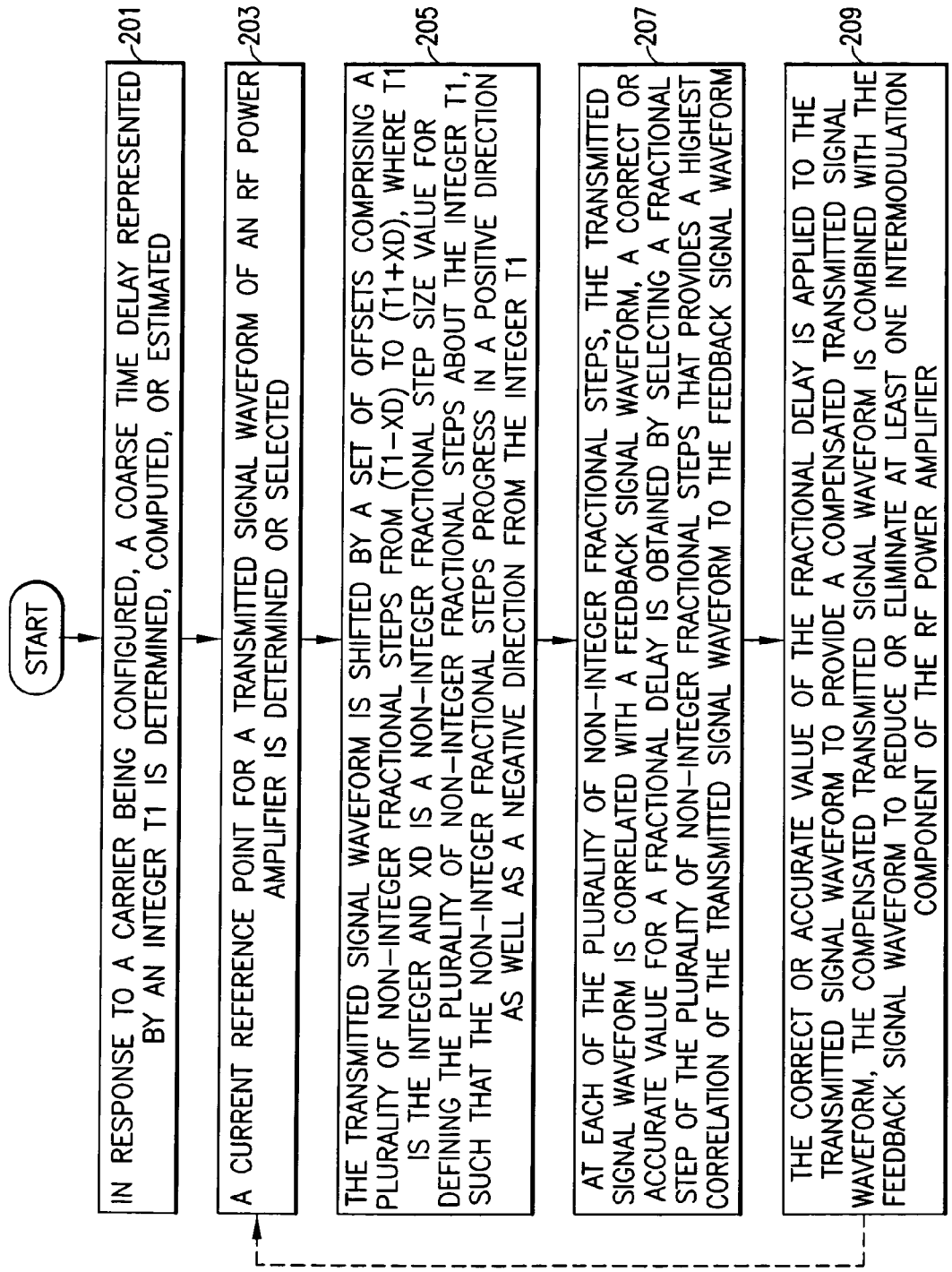
FIG. 2 is a logic flow diagram that illustrates the operation of an exemplary set of methods, and a result of execution of computer program instructions embodied on a computer readable memory, in accordance with various exemplary embodiments.

FIG. 2 is a logical flow diagram that illustrates the operation of an exemplary set of methods, and a result of execution of computer program instructions embodied on a computer readable memory, in accordance with various exemplary embodiments. Thus, the various blocks shown in FIG. 2 may be viewed as method steps, and/or as operations that result from operation of computer program code, and/or as a plurality of coupled logic circuit elements constructed to carry out the associated functions. The operational sequence of FIG. 2 commences at block 201 where, in response to a carrier being configured, a coarse time delay represented by an integer T1 is determined, computed, or estimated. For example, assume that a time delay value for the integer T1 has been estimated as T1=155. Next, at block 203, a current reference point for a transmitted signal waveform of an RF power amplifier is determined or selected.

The operational sequence of FIG. 2 progresses to block 205 where the transmitted signal waveform is shifted by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1. For example, if Xd=1, then the transmitted signal waveform is shifted in time by T1-1, T1-0.9, T1-0.8 . . . T1, T1+0.1, T1+0.2 . . . T1+1.0. This example uses fractional steps of 0.1 solely for purposes of illustration, as fractional steps are not limited to 0.1. Further, the formulas and expressions that use these various parameters may differ from those expressly disclosed herein. The non-integer fractional steps of block 205 may, but need not, be achieved by implementing one or more state shifts in a digital-to-analog converter. Alternatively or additionally, a fractional delay filter may be utilized. Alternatively or additionally, a field-programmable gate array (FPGA) implementation may implement fractional delay by inserting additional gates between a transmit path and a feedback path. Normally, each of the gate arrays of the FPGA would be configured to provide a constant or fixed delay.

The operational sequence of FIG. 2 progresses to block 207 where, at each of the plurality of non-integer fractional steps, the transmitted signal waveform is correlated with a feedback signal waveform. A correct or accurate value for the fractional delay is obtained by selecting a fractional step of the plurality of non-integer fractional steps that provides a highest, greatest, or maximum correlation of the transmitted signal waveform to the feedback signal waveform. Next, at block 209, the correct or accurate value of the fractional delay is applied to the transmitted signal waveform to provide a compensated transmitted signal waveform. The compensated transmitted signal waveform is combined with the feedback signal waveform to reduce or eliminate at least one intermodulation component of the RF power amplifier.

The transmitted signal waveform of blocks 201, 203, 205, 207 and 209 may represent either a pre-distorted waveform for correcting RF power amplifier linearity, or a non pre-distorted waveform to which a correction may subsequently be applied. Once the correct value of fractional delay is obtained, this value is kept fixed for a certain or predetermined period of time. Using the correct fractional delay results in improved intermodulation correction for the RF power amplifier.

Optionally, blocks 203, 205, 207 and 209 may be repeated in response to aging, temperature fluctuations, changes in RF power amplifier supply voltage, changes in RF power amplifier current consumption, or measuring an incorrect fractional delay as evidenced by degraded intermodulation performance.

Optionally, the operational sequence of FIG. 2 may further enhance correlation accuracy by considering higher-order products in the transmitted signal waveform. In other words, if the transmitted signal waveform is x(t), then the accuracy of the correlation can be improved by including higher-order terms for the transmitted waveform to improve correlation accuracy, thereby resulting in a more accurate estimate of fractional delay. Alternatively or additionally, the shifted transmitted signal waveform of block 205 may be passed through an actual RF power amplifier model. The resultant transmitted signal waveform y(t) is then used to correlate with the feedback signal waveform.

The consideration of higher-order products into the transmitted signal waveform implements a simplified RF power amplifier model that utilizes only third-order intermodulation products. However, actual implementations may be configured to consider intermodulation products in addition to, or in lieu of, the third-order intermodulation products. Considering third-order intermodulation products as well as higher-order intermodulation products will enhance the correlation between the transmitted signal waveform and the feedback signal waveform relative to considering third-order intermodulation products only. The approach of passing the shifted transmitted signal waveform through an actual RF power amplifier model may produce better correlation accuracy than simply considering higher-order products in the transmitted signal waveform.

Figure 3:
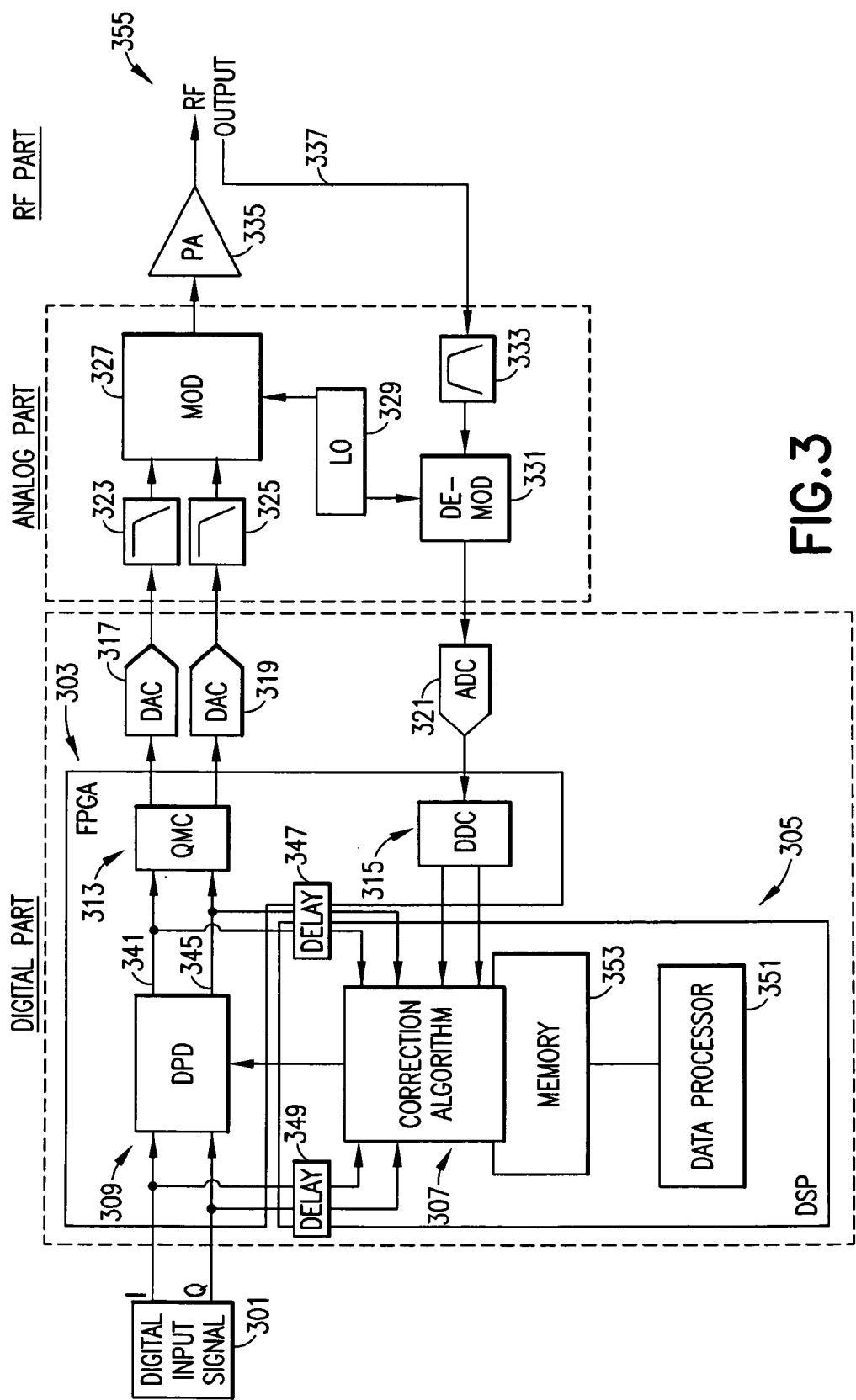
FIG. 3 is a block diagram of an illustrative apparatus in which the exemplary embodiments of FIG. 2 may be practiced.

FIG. 3 is a block diagram of an illustrative apparatus in which the exemplary embodiments of FIG. 2 may be practiced. A digital input signal 301 is provided, for example, in quadrature form including an I component and a Q component. The digital input signal 301 is received by a digital predistorter (DPD) 309. The DPD 309 may, but need not, be implemented using a field-programmable gate array (FPGA) 303. The output of the DPD 309, including a first predistorted output signal 341 corresponding to the I component and a second predistorted output signal 345 corresponding to the Q component, is received by a quadrature modulation compensator (QMC) 313. The QMC 313 provides a first compensated and predistorted output signal corresponding to the I component to a first digital to analog converter (DAC) 317. The QMC 313 also provides a second compensated and predistorted output signal corresponding to the Q component to a second digital to analog converter (DAC) 319.

The first predistorted output signal 341 corresponding to the I component and the second predistorted output signal 345 corresponding to the Q component are each processed by a delay 347 line. The delayed first and second predistorted output signals 341 and 345 are received by a correction algorithm 307. The correction algorithm 307 also receives a delayed digital input signal 301 that has been delayed by a delay 349 line. The correction algorithm includes computer-executable instructions for performing the operational sequence of FIG. 2. The correction algorithm 307 may, but need not, be executed using a digital signal processor (DSP) 305. For example, the DSP 305 may include a computer or data processor 351 operatively coupled to a tangible computer-readable memory 353 wherein the memory 353 stores instructions for implementing the correction algorithm 307 as previously described in connection with the operational sequence of FIG. 2.

The output of DAC 317 is filtered by a first lowpass filter 323, and the filtered output is received by a modulator (MOD) 327. Similarly, the output of DAC 319 is filtered by a second lowpass filter 325, and the filtered output is received by the MOD 327. The MOD 327 also receives an RF carrier signal generated by a local oscillator (LO) 329. The MOD 327 applies a modulating signal comprising the filtered outputs of the DACs 317 and 319 to the RF carrier signal generated by the LO 329 to provide a modulated signal that is received by an input of an RF power amplifier (PA) 335. Note that the LO 329 may, but need not, generate an RF carrier signal at a desired or specified RF output 355 frequency. For example, the LO 329 may generate a signal at a lower frequency than the desired or specified RF output 355 frequency, in which case the MOD 327 may include a frequency up-converter for converting the lower frequency to the desired or specified RF output 355 frequency.

A portion of the RF output 355 of the PA 335 is sampled 337 and filtered by a bandpass filter 333. The filtered sampled signal is received by an analog to digital converter (ADC) 321 which converts the filtered sampled signal into a digitized sampled signal. The digitized sampled signal is received by a digital downconverter (DDC) 315 which downconverts the digitized sampled signal so that the digitized sampled signal may be processed by the correction algorithm 307.

The data processor 351 and the memory 353 are described as being provided in the form of the DSP 305 for illustrative purposes only. It should be noted that the memory 353 and the data processor 351 may each be implemented using discrete elements. Alternatively, the memory 353 and the data processor 351 could be integrated into a single application-specific integrated circuit chip. More generally, various exemplary embodiments may be implemented by hardware, or by a combination of software and hardware (and firmware). The memory 353 may be of any type suitable to the local technical environment and may be implemented using any suitable data storage technology, such as semiconductor based memory devices, flash memory, magnetic memory devices and systems, optical memory devices and systems, fixed memory and removable memory. Likewise, the data processor 351 may be of any type suitable to the local technical environment, and may include one or more of general purpose computers, special purpose computers, microprocessors, digital signal processors (DSPs) and processors based on a multicore processor architecture, as non-limiting examples.

Figure 4:
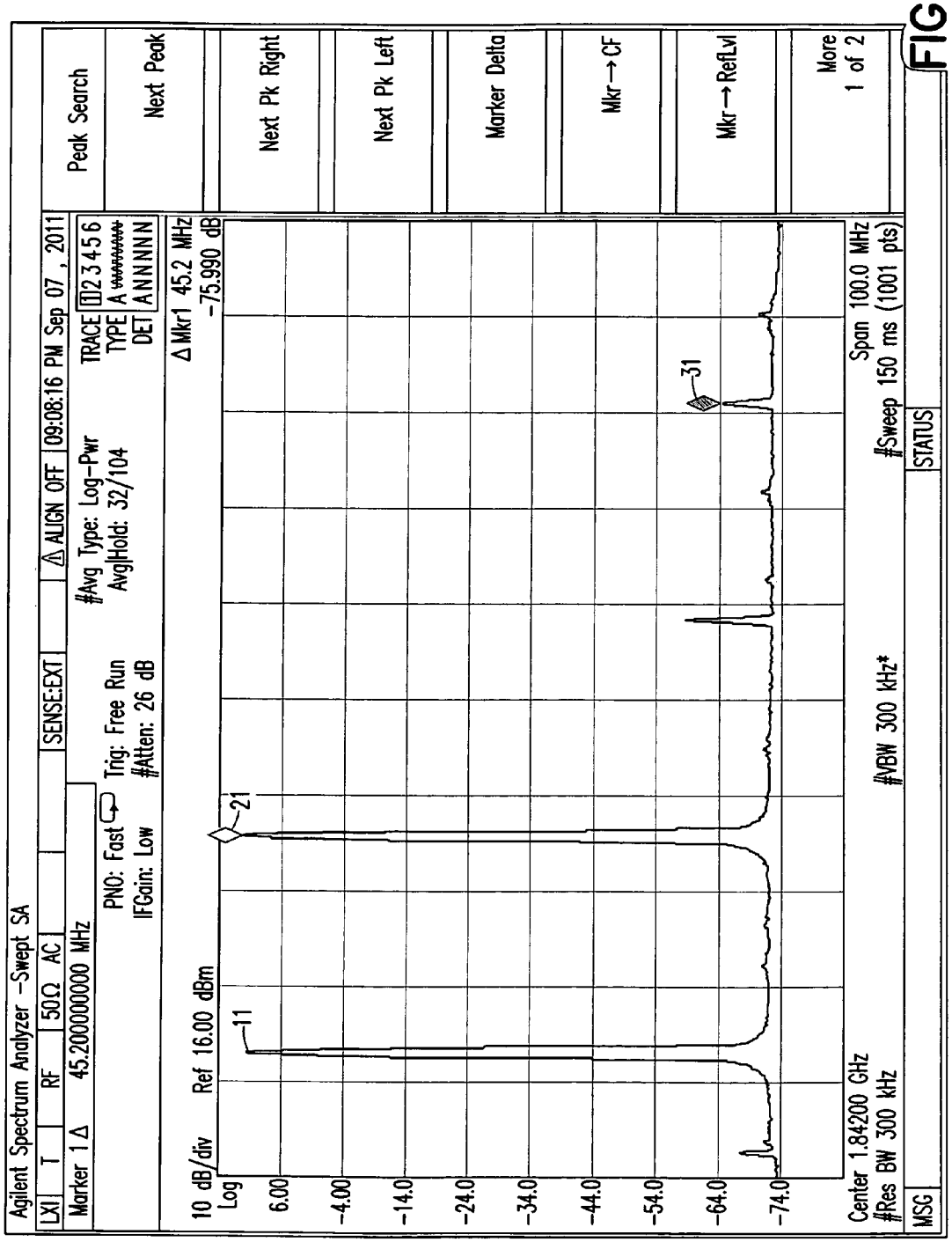
FIG. 4 is a spectral plot of amplitude as a function of frequency using any of the intermodulation correction methods described in conjunction with FIG. 2.

FIG. 4 is a spectral plot of amplitude as a function of frequency using any of the intermodulation correction methods described in conjunction with FIG. 2. A first carrier 11 is present at a first frequency and has an amplitude of approximately 16 dBm. A second carrier 21 is present at a second frequency that is 22.6 MHz above the first frequency. The second carrier 21 also has an amplitude of approximately 16 dBm. A fifth-order intermodulation component 31 that is 45.2 MHz above the second carrier 21 has an amplitude that is 75.9 dB below the amplitudes of the first and second carriers 11, 21. Accordingly, the spectral plot of FIG. 4 clearly indicates that all intermodulation products are within the allowable limits set forth in the 3GPP specification.

The preferred embodiments of the invention described herein provide various technical effects and benefits which include, but are not limited to, reducing or eliminating intermodulation components in an RF power amplifier. An additional effect is the avoidance of having to provide multiple product variants for the same frequency band. Moreover, rather than providing two transmit front end filters per unit, a single filter may be employed, thereby saving unit space and cost.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although not limited thereto. While various aspects of the exemplary embodiments may be illustrated and described as block diagrams, flow charts, or using some other pictorial representation, it is well understood that these blocks, apparatus, systems, techniques or methods described herein may be implemented in, as nonlimiting examples, hardware, software, firmware, special purpose circuits or logic, general purpose hardware or controller or other computing devices, or some combination thereof.

It should thus be appreciated that at least some aspects of the exemplary embodiments may be practiced in various components such as integrated circuit chips and modules, and that the exemplary embodiments may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry and radio frequency circuitry that are configurable so as to operate in accordance with the exemplary embodiments.

Various modifications and adaptations to the foregoing exemplary embodiments may become apparent to those skilled in the relevant arts in view of the foregoing description, when read in conjunction with the accompanying drawings. However, any and all modifications will still fall within the scope of the non-limiting and exemplary embodiments.

For example, while the exemplary embodiments have been described above, it should be appreciated that the exemplary embodiments are not limited for use with only one particular type of wireless communication system, and that they may be used to advantage in other wireless communication systems such as for example E-UTRAN (UTRAN-LTE), WLAN, UTRAN, or GSM, as appropriate.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

An exemplary embodiment provides a method for selectively performing beam formation using a RF chip-based antenna array. The method includes determining (such as by a processor for example) whether to use a plurality of antenna arrays in one or more common carrier substrates in either a single group or a plurality of groups. The method also includes, in response to determining to use the plurality of antenna arrays in a single group, providing (such as by a transmitter for example) a single coupling factor to all antenna arrays in the plurality of antenna arrays and, in response to determining to use the plurality of antenna arrays in a plurality of groups, providing (such as by a transmitter for example), for each group in the plurality of groups, a group-specific coupling factor to each antenna array in the group.

Another exemplary embodiment provides an apparatus for selectively performing beam formation using a RF chip-based antenna array. The apparatus includes at least one processor (such as DP 1224 for example) and at least one memory (such as MEM 1226 for example) storing computer program code (such as PROG 1228 for example). The at least one memory and the computer program code are configured to, with the at least one processor, cause the apparatus to perform actions. The actions include determining whether to use a plurality of antenna arrays in one or more common carrier substrates in either a single group or a plurality of groups. The actions also include, in response to determining to use the plurality of antenna arrays in a single group, providing a single coupling factor to all antenna arrays in the plurality of antenna arrays and, in response to determining to use the plurality of antenna arrays in a plurality of groups, providing, for each group in the plurality of groups, a group-specific coupling factor to each antenna array in the group.

Another exemplary embodiment provides a computer readable medium for selectively performing beam formation using a RF chip-based antenna array. The computer readable medium (such as MEM 1226 for example) is tangibly encoded with a computer program (such as PROG 1228 for example) executable by a processor (such as DP 1224 for example) to perform actions. The actions include determining whether to use a plurality of antenna arrays in one or more common carrier substrates in either a single group or a plurality of groups. The actions also include, in response to determining to use the plurality of antenna arrays in a single group, providing a single coupling factor to all antenna arrays in the plurality of antenna arrays and, in response to determining to use the plurality of antenna arrays in a plurality of groups, providing, for each group in the plurality of groups, a group-specific coupling factor to each antenna array in the group.

Another exemplary embodiment provides an apparatus for selectively performing beam formation using a RF chip-based antenna array. The apparatus includes means for determining (such as a processor for example) whether to use a plurality of antenna arrays in one or more common carrier substrates in either a single group or a plurality of groups. The apparatus also includes means for providing (such as a transmitter for example) a single coupling factor to all antenna arrays in the plurality of antenna arrays in response to determining to use the plurality of antenna arrays in a single group, and means for providing (such as a transmitter for example), for each group in the plurality of groups, a group-specific coupling factor to each antenna array in the group in response to determining to use the plurality of antenna arrays in a plurality of groups.

Furthermore, some of the features of the various non-limiting and exemplary embodiments may be used to advantage without the corresponding use of other features. As such, the foregoing description should be considered as merely illustrative of the principles, teachings and exemplary embodiments, and not in limitation thereof.

The following abbreviations that may be found in the specification and/or the drawing figures are defined as follows:

3GPP third generation partnership project
ADC analog to digital converter
BW bandwidth
DAC digital to analog converter
DPD digital pre-distortion
DL downlink (eNB towards UE)
eNB E-UTRAN Node B (evolved Node B)
E-UTRAN evolved UTRAN (LTE)
FDD frequency division duplex
GSM global system for mobile
IC integrated circuit
IF intermediate frequency
IMT-A international mobile telephony-advanced
ITU international telecommunication union
ITU-R ITU radiocommunication sector
LO local oscillator
LTE long term evolution of UTRAN (E-UTRAN)
Node B base station
RF radio frequency
RFIC radio frequency integrated circuits
TDD time division duplex
TX transmit/transmitter
UE user equipment, such as a mobile station or mobile terminal
UL uplink (UE towards eNB)
UTRAN universal terrestrial radio access network

What is claimed is:

1. A method comprising:
    determining, estimating, or computing a coarse time delay represented by an integer T1;
    determining or selecting a current reference point for a transmitted signal waveform of an RF power amplifier;
    shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1;
    at each of the plurality of non-integer fractional steps, correlating the transmitted signal waveform with a feedback signal waveform to obtain a respective correlation value for each of corresponding fractional steps of the plurality of non-integer fractional steps;
    obtaining a correct fractional delay value by selecting a fractional step of the plurality of non-integer fractional steps having a highest respective correlation value;
    applying the obtained correct fractional delay value to the transmitted signal waveform to provide a compensated transmitted signal waveform, and
    combining the compensated transmitted signal waveform with the feedback signal waveform to reduce or eliminate at least one intermodulation product of the RF power amplifier.

2. The method of claim 1 wherein the correct value remains fixed for a predetermined period of time.

3. The method of claim 1 wherein the transmitted signal waveform represents a pre-distorted waveform for correcting RF power amplifier linearity.

4. The method of claim 1 wherein the transmitted signal waveform represents a non pre-distorted waveform to which an intermodulation correction may subsequently be applied.

5. The method of claim 1 wherein obtaining the correct value for the fractional delay is repeated in response to any of aging, temperature fluctuations, changes in RF power amplifier supply voltage, changes in RF power amplifier current consumption, or measuring an incorrect fractional delay as evidenced by degraded intermodulation performance.

6. The method of claim 1 wherein the shifting is achieved by implementing one or more state shifts in a digital-to-analog converter.

7. The method of claim 1 wherein the shifting is achieved by using a fractional delay filter.

8. The method of claim 1 wherein the shifting is achieved by using a field-programmable gate array (FPGA) to implement fractional delay by inserting one or more additional gates between a transmit path and a feedback path.

9. The method of claim 1 further comprising considering a plurality of higher-order products in the transmitted signal waveform.

10. The method of claim 9 further comprising passing the shifted transmitted signal waveform through an RF power amplifier model wherein the shifted transmitted signal waveform includes the plurality of higher-order products and using a transmitted signal waveform y(t) of the RF power amplifier model to correlate with the feedback signal waveform.

11. An apparatus, comprising at least one processor; and at least one memory including computer program code, the at least one memory and the computer program code configured to, with the at least one processor, cause the apparatus to perform at least the following:
  determining, estimating, or computing a coarse time delay represented by an integer T1;
  determining or selecting a current reference point for a transmitted signal waveform of an RF power amplifier;
  shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1;
  at each of the plurality of non-integer fractional steps, correlating the transmitted signal waveform with a feedback signal waveform to obtain a respective correlation value for each of corresponding fractional steps of the plurality of non-integer fractional steps;
  obtaining a correct fractional delay value by selecting a fractional step of the plurality of non-integer fractional steps having a highest respective correlation value;
  applying the obtained correct fractional delay value to the transmitted signal waveform to provide a compensated transmitted signal waveform, and
  combining the compensated transmitted signal waveform with the feedback signal waveform to reduce or eliminate at least one intermodulation product of the RF power amplifier.

12. The apparatus of claim 11 wherein the correct value remains fixed for a predetermined period of time.

13. The apparatus of claim 11 wherein the transmitted signal waveform represents a pre-distorted waveform for correcting RF power amplifier linearity.

14. The apparatus of claim 11 wherein the transmitted signal waveform represents a non pre-distorted waveform to which an intermodulation correction may subsequently be applied.

15. The apparatus of claim 11 wherein obtaining the correct value for the fractional delay is repeated in response to any of aging, temperature fluctuations, changes in RF power amplifier supply voltage, changes in RF power amplifier current consumption, or measuring an incorrect fractional delay as evidenced by degraded intermodulation performance.

16. The apparatus of claim 11 wherein the shifting is achieved by implementing one or more state shifts in a digital-to-analog converter.

17. The apparatus of claim 11 wherein the shifting is achieved by using a fractional delay filter.

18. The apparatus of claim 11 wherein the shifting is achieved by using a field-programmable gate array (FPGA) to implement fractional delay by inserting one or more additional gates between a transmit path and a feedback path.

19. The apparatus of claim 11 further comprising considering a plurality of higher-order products in the transmitted signal waveform.

20. The apparatus of claim 11 further comprising passing the shifted transmitted signal waveform through an RF power amplifier model wherein the shifted transmitted signal waveform includes the plurality of higher-order products and using a transmitted signal waveform y(t) of the RF power amplifier model to correlate with the feedback signal waveform.

21. A non-transitory computer readable medium tangibly encoded with a computer program executable by a processor to perform actions comprising:
  determining, estimating, or computing a coarse time delay represented by an integer T1;
  determining or selecting a current reference point for a transmitted signal waveform of an RF power amplifier;
  shifting the transmitted signal waveform by a set of offsets comprising a plurality of non-integer fractional steps from (T1−Xd) to (T1+Xd) where T1 is the integer and Xd is a non-integer fractional step size value for defining the plurality of non-integer fractional steps about the integer T1 such that the non-integer fractional steps progress in a positive direction as well as a negative direction from the integer T1;
  at each of the plurality of non-integer fractional steps, correlating the transmitted signal waveform with a feedback signal waveform to obtain a respective correlation value for each of corresponding fractional steps of the plurality of non-integer fractional steps;
  obtaining a correct fractional delay value by selecting a fractional step of the plurality of non-integer fractional steps having a highest respective correlation value;
  applying the obtained correct fractional delay value to the transmitted signal waveform to provide a compensated transmitted signal waveform, and
  combining the compensated transmitted signal waveform with the feedback signal waveform to reduce or eliminate at least one intermodulation product of the RF power amplifier.

* * * * *